United States Patent [19]
Wang

[11] 3,750,268
[45] Aug. 7, 1973

[54] POLY-SILICON ELECTRODES FOR C-IGFETS

[75] Inventor: Raymond C. Wang, Tempe, Ariz.
[73] Assignee: Motorola, Inc., Franklin Park, Ill.

[22] Filed: Sept. 10, 1971
[21] Appl. No.: 179,398

[52] U.S. Cl. .................................... 29/571, 317/235
[51] Int. Cl. .................................... H01l 11/14, B01j
[58] Field of Search ....................... 29/571, 589, 578; 317/235, 235 B, 235 AT

[56] References Cited
UNITED STATES PATENTS

| | | | |
|---|---|---|---|
| 3,576,478 | 4/1971 | Watkins | 317/235 |
| 3,673,679 | 7/1972 | Carbajal et al. | 29/571 |
| 3,673,471 | 6/1972 | Klein et al. | 29/571 |

*Primary Examiner*—Milton S. Mehr
*Attorney*—Mueller & Aichele

[57] ABSTRACT

Poly-silicon electrodes are provided for use with source and drain regions of insulated gate field-effect transistors as well as a method for contacting silicon gate devices utilizing poly-silicon electrodes and a single etching step. The single etching step obviates the use of an additional masking operation for forming preohmic holes in the vicinity of the source and drain regions for the device. The provision of preohmic holes at the source and drain regions necessitates large area source and drain regions so as to permit clearance for the metallization through preohmic holes. These large areas decrease packing density. The subject method however permits high density packing of the silicon gate devices because small area source and drain regions and small area electrodes can be used. Because of the use of poly-silicon electrodes, the process allows the probing of the chip at intermediate stages in device fabrication. This allows the elimination of those chips which have not satisfied design limitations at an intermediate step in the fabrication process. In the process the source and drain regions and the electrodes are doped simultaneously in a diffusion step. In this diffusion process part of the source and drain regions are diffused through that portion of the poly-silicon contact extending over the source or drain region. In this manner ohmic contact is made between the electrodes and the underlying source or drain regions.

8 Claims, 11 Drawing Figures

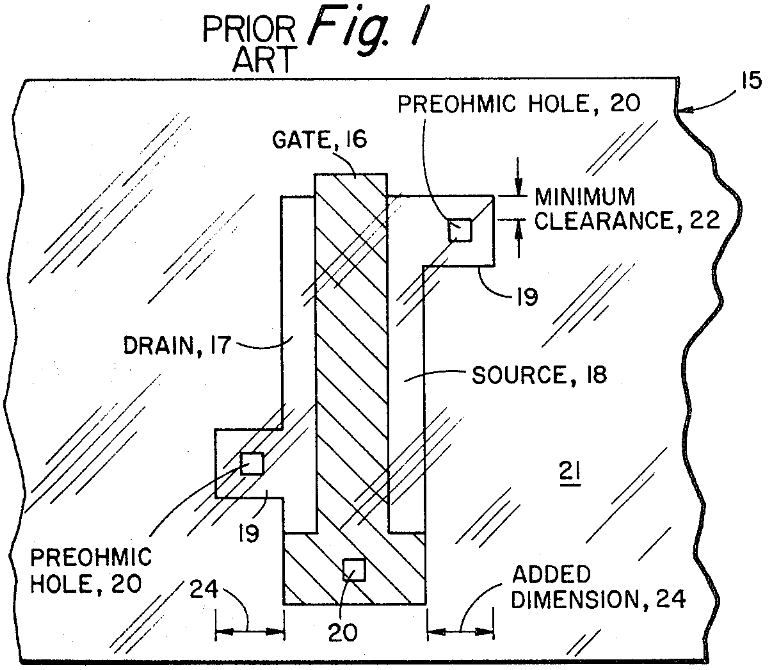
PRIOR ART Fig. 1
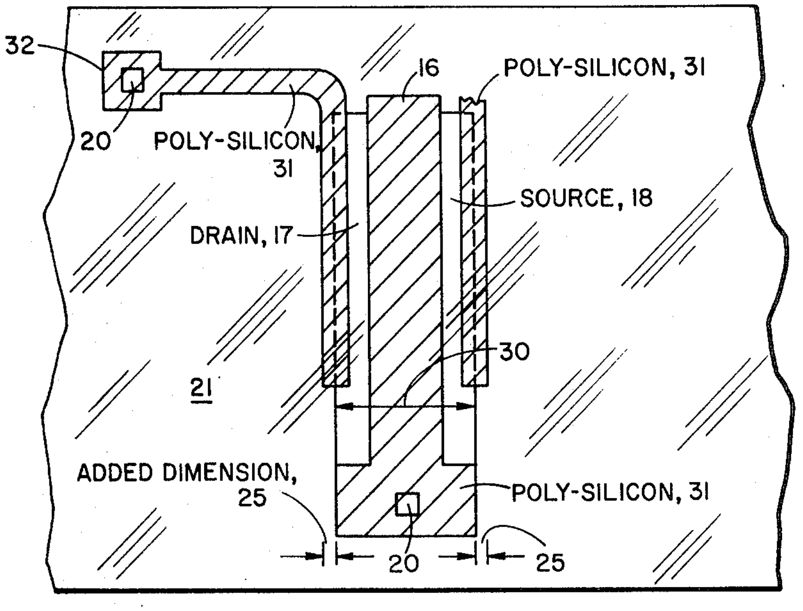
Fig. 2
INVENTOR.
Raymond C. Wang
BY
Mueller & Aichele
ATTY'S.

INVENTOR

Raymond C. Wang

BY Mueller & Aichele

ATTY'S.

INVENTOR
Raymond C. Wang
BY
Mueller & Aichele
ATTY'S.

POLY-SILICON ELECTRODES FOR C-IGFETS

BACKGROUND OF THE INVENTION

This invention relates to contacts for insulated gate field-effect transistors (IGFETs) and more particularly to a method of providing poly-silicon electrodes for not only the gate portion of these devices but also for the source and drain regions.

There are two major problems which confront the industry in the fabrication of a large number of insulated gate field-effect transistors on a single wafer. The first of these problems relates to packing density. Even in silicon gate devices using polycrystalline material for the gate electrode, metal electrodes are used for the source and drain regions. The packing density of devices using metal source and drain electrodes is severely limited because of mask alignment problems. The mask alignment problem arises in standard IFGET fabrication because of the necessity of forming an insulating layer over top of the device followed by the formation of preohmic holes in the insulating material over the source and drain regions. In order to provide contact areas for these sources and drains, the source and drain regions are enlarged at one end to form contact pads of a size sufficient to provide that mask misalignments will not cause shorting of the source or drain to the substrate. These contact pads oftentimes double the width of the active device thereby limiting the packing density of these devices on a chip. The clearance necessary in standard C-IGFETs is on the order of 0.15 mils. The preohmic hole is on the order of 0.30 mils in width. The combined clearance therefore necessary in a lateral direction across the top surface of a C-IGFET is 1.2 mils. This should be compared to a measurement in the same direction across the active area of the C-IGFET of at most 1.3 mils. Thus, 1.2 mils added dimension was necessary on a standard 1.3 mil device in order to insure the proper contacting. It will be appreciated that in prior art devices utilizing metal electrodes for the source and drain regions, a first masking step was necessary for the diffusion of the source and drain regions followed by a second masking step. This second masking step was necessary to define the position of the preohmic holes above the source and drain regions through a superimposed insulating layer. The proper alignment of the preohmic holes required accurate mask alignment of the second mask with the area created by the first mask.

The subject method solves the mask alignment problem just described by providing narrow contacts to the source and drain regions in a single masking operation, which contacts then run to an area of the chip which can accommodate large contact pads without sacrificing IGFET packing density. A second masking and preohmic operation in these remote areas is not critical because additional space can be provided for the large contact pads without the necessity of providing additional space between IGFETs. These narrow contacts are made possible by the use of doped poly-silicon electrodes which do not require preohmic holes at the site of the source and drain regions.

The second problem associated with the processing of large numbers of IGFET-type devices is the problem of yield. Fabricating large numbers of IGFETs is expensive and proceeding through processing steps with devices which are already inoperative due to prior processing steps adds to the cost. For instance, after a wafer has been provided with $P^+$ diffusions for its P-IGFET devices, it is possible with the subject poly-silicon electrodes to probe a sample device to see if the P type diffusions have been appropriately put down. If they have not been properly made, the wafer can be discarded without the further processing necessary to make the $N^+$ diffusions for the drains of the devices. This in effect saves eight succeeding processing steps. Again, with the subject technique, after the $N^+$ diffusions are made, a device may again be probed prior to the provision of an insulating layer thereon. If the device does not meet test specifications five succeeding processing steps can be eliminated. The five steps saved include the two steps involving the provision of the above mentioned insulating layer. The remaining three steps saved involve a preohmic step, a metal evaporation step and a metal definition step. Parenthetically, after preohmic holes have been made prior to metallization, the chip itself may be probed so that the metallization and evaporation steps can be eliminated if, again, any active device within the chip fails the prescribed test.

The ability to probe requires that there be conductive material on top of the source and drain regions as well as the gate region to enable the making of the tests. These conductive regions are doped poly-silicon with the doping being accomplished during the formation of the source and drain regions. Thus, prior to metallization the chip may be probed to see if the active devices thereon are operating within tolerances. This is impossible in the prior art devices because contact to the prior art devices is made only after the final metallization step, such that all of the process steps prior to metallization have to be done prior to probing and testing.

A saving of processing steps with the use of polysilicon electrodes offers a considerable cost savings in the production of the complementary as well as the single insulated gate field-effect devices.

The term "insulated gate field-effect device" refers to both metal oxide semiconductors (MOS) as well as silicon gate semiconductors since both of these devices utilize an insulated gate. It also refers to those devices having gates of exotic semi-insulating qualities as long as the devices can be provided with poly-silicon electrodes for the source and drain regions. However, if the IGFET is a silicon gate device, the gate electrode as well as the source and drain electrodes can be fabricated at the same time.

Both the savings of active device area and the savings accumulated through the ability to probe prior to final fabrication of the device offer the industry much increased cost savings as well as a new structure for contacting insulated gate field-effect transistor type devices. The structure which is new is the ohmic contact between the source or drain region and a corresponding poly-silicon electrode. This ohmic contact exists because a portion of the source or drain region immediately under the poly-silicon contact is doped through the overlying poly-silicon electrode. Thus there is provided simultaneous doping of the source or drain regions and corresponding poly-silicon regions.

SUMMARY OF THE INVENTION

It is therefore an object of this invention to provide an improved electrode structure for contacting insulated gate field-effect devices.

It is a further object of this invention to provide poly-silicon electrodes for the gate and source regions of insulated gate field-effect transistors.

It is a still further object of this invention to provide a method for making contact to the source and drain regions of insulated gate field-effect transistors by utilizing poly-silicon electrodes, which electrodes and source and drain regions are doped in a single diffusion process thereby minimizing the area of the poly-silicon electrode in the vicinity of the active device while at the same time forming an ohmic contact between the electrode and the source or drain region.

It is a still further object of this invention to provide a process for forming an insulated gate field-effect transistor-type device in which the device may be probed at intermediate points in the processing so as to determine at intermediate points in the processing when an unacceptable device has been fabricated.

Other objects and features of this invention will become more fully apparent upon reading the following description taken in conjunction with the accompanying drawings.

BRIEF DESCRIPTION OF THE DRAWINGS

FIG. 1 is a top view of a typical insulated gate field-effect device showing the necessary enlargements of the source and drain regions to accommodate preohmic hole misalignments due to mask registration problems associated with the metallization steps for the device.

FIG. 2 shows a top view of the subject insulated gate field-effect transistor showing poly-silicon electrodes covering the source and drain regions indicating the space saving which can be achieved thereby.

BRIEF DESCRIPTION OF THE INVENTION

Figures 3, 4, 5, 6, 7, 8:
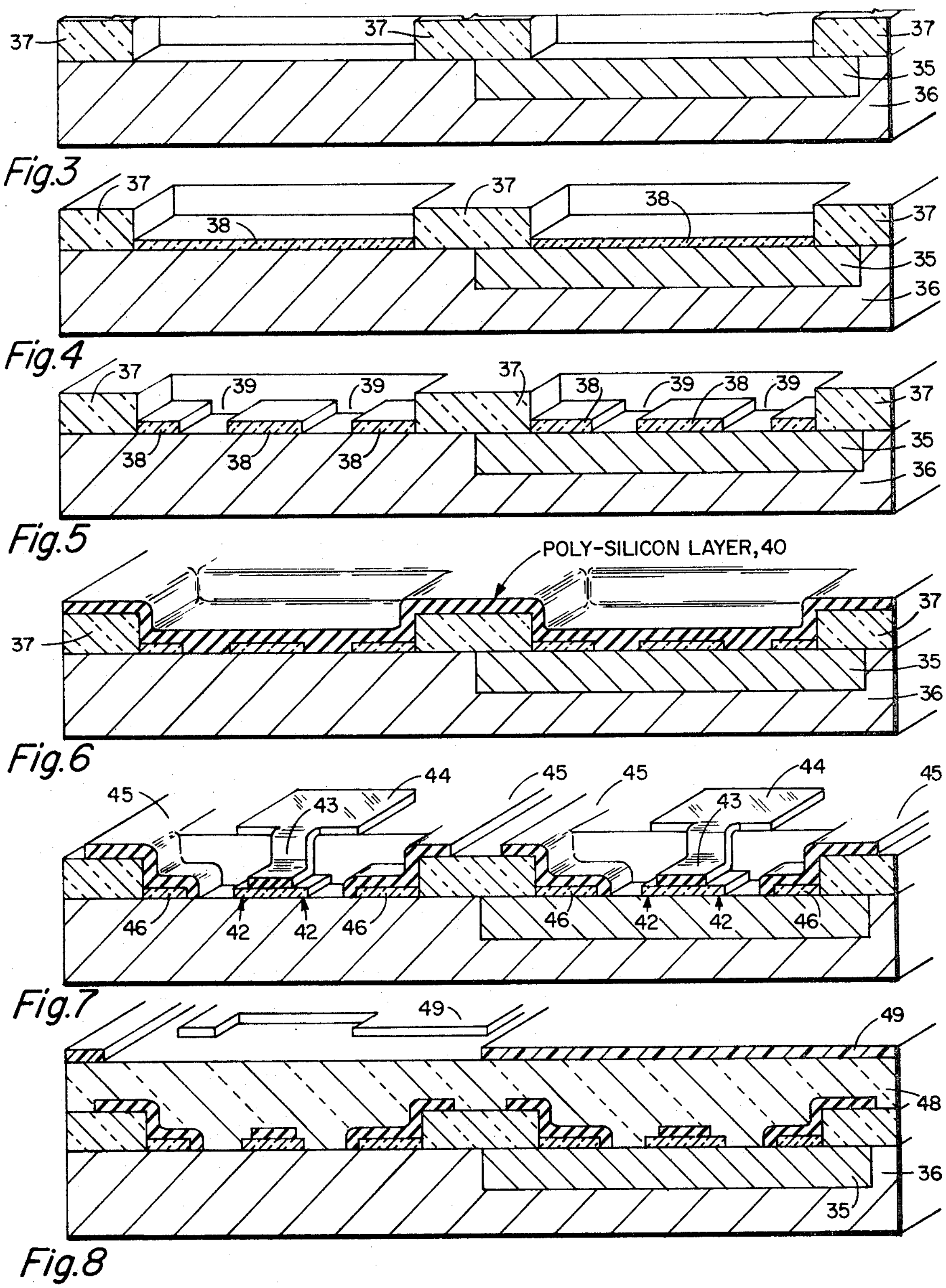
FIGS. 3 through 10 are cross-sectional and partial isometric views showing the fabrication of a complementary insulated gate field-effect transistor-type device utilizing poly-silicon electrodes throughout.
Figure 9:
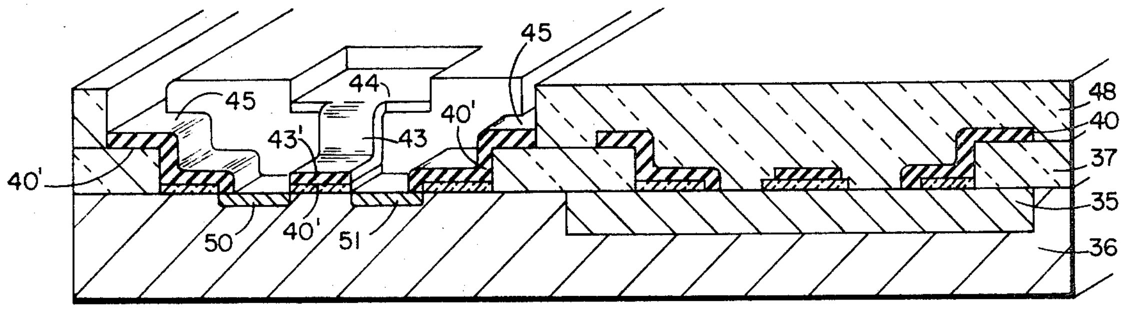

Poly-silicon electrodes are provided for use with insulated gate field-effect transistors as well as a method for contacting silicon gate devices utilizing poly-silicon electrodes and a single etching step. The single etching step obviates the use of an additional masking operation for forming preohmic holes in the vicinity of the source and drain regions for the device. The provision of preohmic holes at the source and drain regions necessitates large area source and drain regions so as to permit clearance for the metallization through preohmic holes. These large areas decrease packing density. The subject method however permits high density packing of the silicon gate devices because small area source and drain regions and small area electrodes can be used. Because of the use of polysilicon electrodes, the process allows the probing of the chip at intermediate stages in device fabrication. This allows the elimination of those chips which have not satisfied design limitations at an intermediate step in the fabrication process. In the process the source and drain regions and the electrodes are doped simultaneously in a diffusion step. In this diffusion process part of the source and drain regions are diffused through that portion of the poly-silicon contact extending over the source or drain region. In this manner ohmic contact is made between the electrodes and the underlying source or drain regions.

DETAILED DESCRIPTION OF THE INVENTION

The term "poly-silicon" as used herein refers to polycrystalline silicon which has a disordered crystallographic structure. As the crystallites themselves becone smaller and approach the sub-micron level, polycrystalline silicon material approaches amorphous silicon in quality. Amorphous silicon as well as the poly-silicon have a certain disordering of the crystallographic structure and are both characterized by the speed at which doping impurity atoms travel therethrough. Thus, when the term "poly-silicon" is used, it refers not only to the rather large grain polycrystalline silicon contacts described herein but also to amorphous silicon contacts provided by the subject process where the only difference lies in the size of the crystallite structures of the electrode itself.

As mentioned hereinbefore, insulated gate field-effect transistors in general have source and drain regions which are extended so as to permit contact thereto by an overlying metallization system. A top view of such a prior art device is shown in FIG. 1. The device is mounted on a substrate 15 and includes a gate region 16 overlying source and drain regions 17 and 18 which source and drain regions have extensions 19 so as to permit the formation of preohmic holes 20 in the immediate vicinity of the source and drain regions through a passivation layer 21 shown covering the entire device. It will be appreciated from this top view that extensions 19 are necessary to provide a minimum clearance 22 as shown at the top portion of this Figure so as to eliminate any problems with the misalignment of a preohmic hole-forming mask with respect to the substrate 15 during the formation of the preohmic holes 20. A typical size for a preohmic hole is 0.3 mils × 0.3 mils with the minimum clearance being on the order of 0.15 mils in each direction. The added dimension required by this minimum clearance is shown by the arrows 24 to be the 0.3 mil required for the preohmic hole plus the 0.3 mil necessary for clearance on either side of the preohmic hole making each protrusion 0.6 mil in width. With two protrusions as shown in FIG. 1, this adds 1.2 mils to the overall size of the device.

A similar device to that shown in FIG. 1, is shown in FIG. 2 with like numbers labelled in a like manner showing the use of a poly-silicon gate electrode as well as poly-silicon drain and source electrodes. As can be seen from this Figure, the added dimension for the gate and source contacts at the active device is shown by the arrow 25. In general, the overlap clearance necessary when using poly-silicon electrodes in the subject technique is only on the order of 0.1 mil such that the overall linear dimension added to the active region of the insulated gate field-effect transistor device is only 0.2 mils out of a total active device width of approximately 1.3 mils measured as shown by the arrow 30. It will be appreciated in respect to FIG. 2, that the poly-silicon electrodes 31 are put down prior to the formation of the passivation layer 21 thus permitting probing before completion of the device. This passivation layer can be made to extend across the surface of the substrate 15 to a convenient contact pad 32 where the preohmic holes can be made so as to complete the contact to the insulated gate field-effect transistor. This permits the side-by-side packing of the active devices so as to eliminate the useless area between the extensions 19 of adjacent devices of the type shown in FIG. 1.

Figure 10:
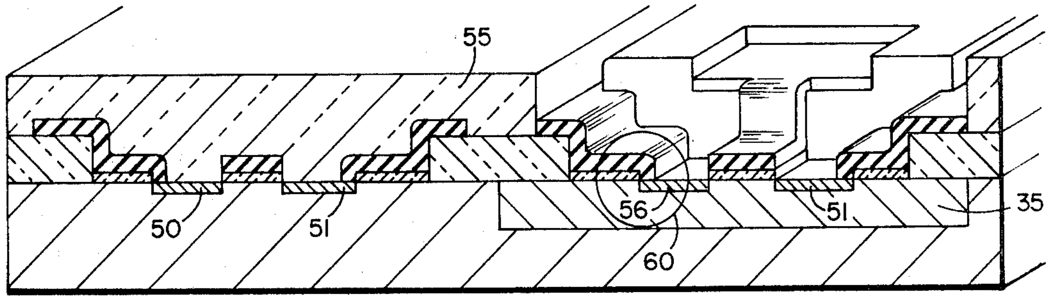
Figure 11:
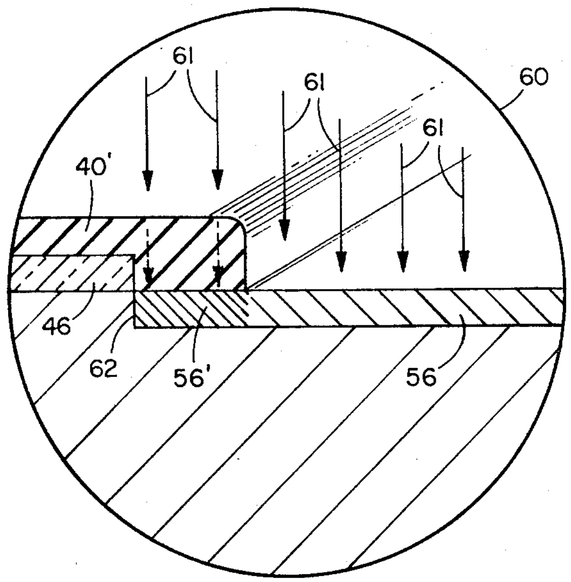
FIG. 11 is an enlarged portion of the circled region shown in FIG. 10, indicating the self-doping and the self-alignment of the contact with the source or drain region in a single diffusion step of the subject process.

Referring now to FIGS. 3 through 10, a table is provided showing one possible method of forming the poly-silicon electrode structures shown in FIG. 2 as well as the enlarged version shown in FIG. 11. The first portion of this table recites two standard techniques for achieving the structure shown in FIG. 3.

TABLE I

| | |
|---|---|
| SUBSTRATE PREPARATION | |
| A. DIFFUSED TUB | EPI-REFILL TUB |
| Sub: N-Type, 5$\Omega$-cm <100> | Sub: P-Type, 2$\Omega$-cm <100> |
| 1. HCl Etch: Epi $SiO_x$: 10$\mu$+ 1KA | 1. Thermal $SiO_x$: 5KA |
| 2. Thermal $SiO_x$: 4KA | 2. $N^-$ Pot Key Etch: HF & KOH (20$\mu$) |
| 3. $P^-$ Tub Etch | 3. Thermal $SiO_x$: 15KA |
| 4. $P^-$ Tub Diffusion | 4. $N^-$ Pot Etch: HF & KOH (30$\mu$) |
| 5. $P^-$ Tub Etch Back | 5. Epi-Poly Si: 2-4$\Omega$-cm, 40$\mu$ |
| 6. Thermal $SiO_x$: 5A | 6. Post-Epi Polish |
| | 7. HCl Etch + Epi $SiO_x$: 4$\mu$ & 2KÅ |
| | 8. Thermal $SiO_x$: 5KÅ |
| C-IGFET PREPARATION | 1. Active Area Etch |
| | 2. Gate Oxidation: 1KÅ |
| | 3. Poly-Evaporation or Deposition: 4KÅ |
| | 4. Gate Definition: Poly-Si Etch Only |
| | 5. $SiO_x$ Deposition: 2KA |
| | 6. P-IGFET Electrode Definition |
| | 7. $P^+$ Diffusion |
| Probe P-IGFET → | |
| | 8. $SiO_x$ Deposition 2KÅ |
| | 9. NMOS Electrode Definition |
| | 10. $N^+$ Diffusion |
| Probe N-IGFET → | |
| METALLIZATION | 11. $SiO_x$ Deposition 4KÅ |
| | 12. Densification: 10 min. $Cl_3$@9.75°C |
| | 13. Pre-ohmic |
| Probe P & N IGFETs → | |
| | 14. MOS Al-SiEEvaporation |
| | 15. Metal Definition |
| | 16. Evaluation & All The Way Going Through Au-Backing |

The arrows in Table I indicate the points in the process at which the structure can be probed for electrical properties. It will be apparent that the P-IGFET can be probed after step 7; the N-IGFET after step 10 and the P and N-IGFET combination after step 13.

The following is a description of the preparation of the substrate so as to achieve the structure shown in FIG. 3.

SUBSTRATE PREPARATION

The fabrication of silicon gate and complementary IGFET ICs requires the use of a substrate containing both P and N type regions. Once the substrate type is chosen, the opposite type region must be incorporated as the isolation region. Wafers of silicon cut parallel to the <100> plane of Czochralski-grown crystals are first chemically polished to about 20 mils in thickness. In the preparation of the isolation region, or "tub" as it is commonly called, either epi-refill or diffusion techniques can be utilized. In the epi-refill method, the choice of initial substrate can be either type. However, for the diffused method, the substrate must be N type, because of the impurity redistribution of the N type doping atoms depleting at the surface into the silicon oxide.

If the device threshold is designed to be 0.7 volts for both P and N channel IGFETS, the bulk dopings of the substrate and the isolation region are made to be $1.5 \times 10^{16}$ atoms per square centimeter and $4.5 \times 10^{15}$ atoms per square centimeter, respectively, assuming a $Q_{SS}/q$ equal to $1 \times 10^{11}$ atoms per square centimeter. Thus, the doping concentrations for the N type material is on the order of 2.0 ohm-centimeters and the P type material, 1.5 ohm-centimeters.

a. DIFFUSED TUB

An N type silicon wafer of 2 ohm-centimeter material with a crystal orientation of <100> is the initial substrate. To insure surface quality, the wafer is chemically etched by HCl, and then thermally oxidized with a layer of silicon oxide to a thickness of 5,000 angstroms. The oxidation process can be achieved by either dry oxygen at atmospheric pressure with the substrate at 1,200 °C or in oxygen bubbled through 70°C water, also at 1,200°C. Photolithographic techniques are used to delineate, in this case, a $P^-$tub pattern. Next, an ultra-light P diffusion is employed to form the isolation region shown in FIG. 3 at 35 in the substrate 36.

In general, the isolation region diffusion consists of three steps. The first step is called predeposition, and is used to diffuse a relatively thin layer of the highly concentrated impurity into the silicon surface. The second step involves oxidation, in which the wafer is removed from the source of impurity and oxidized with a layer of silicon oxide to prevent any out-diffusion during the subsequent steps. The third step is called the drive-in step. The purpose of this step is to heat the silicon in an impurity free atmosphere to redistribute the impurities originally introduced. This type diffusion using a predeposition but without the oxidation step is also used for source and drain diffusions discussed hereinafter.

In one embodiment boron tribromide ($BBr_3$) is used as a liquid source for an open-tube boron predeposition. The carrier gas used as nitrogen. A small amount of oxygen flow is also included as part of the system to protect the silicon surface and to facilitate the decomposition of $BBr_3$ into $B_2O_3$ as the local source.

In most of the diffusions discussed hereinafter, after the completion of the second and third steps, the impurity concentrations are too high. Hence, the oxide layer is stripped from the article thus produced and the second and third steps are repeated. However, due to the reduced impurity density, the time taken for the further drive-in steps to reduce the impurity concentration is greatly increased. For all practical purposes, the most controllable and repeatable results yield a 1,000 ohm per square sheet resistivity and a 10 micron junction depth for the isolation region or tub. This is equivalent to a surface concentration of $3.5 \times 10^{16}$ atoms per cubic centimeter.

To accomplish a desirable surface concentration of $8 \times 10^{15}$ atoms per cubic centimeter, a layer of 6 micron thick front surface is etched off after the top silicon oxide layer is stripped. The etching step is performed in a vertical reactor at 1,000° C with HCl. This is referred to as step five of the substrate preparation A in Table I. It is believed that there is no cross contamination by out-diffusion from either the N or P type materials during the HCl etching, since the concentration level of either type is rather low. The tub of the P type region as formed not only has the proper surface concentration, but the depth of the tub is now ample for the purpose of providing an N channel IGFET. Finally, as shown by the step six of Table I, the surface is thermally oxidized with a layer of silicon oxide approximately 5,000 angstroms in thickness.

b. Epi-Refill Tub

The initial substrate used for this etching technique is P type silicon having a resistivity of 2 ohm-centimeters and having a <100> crystallographic orientation. Such a wafer is first subjected to a thermal oxidation so as to form 1,500 angstroms of silicon oxide. Then, as shown by step two of Tub Preparation B, the P type silicon substrate is etched utilizing a potassium hydroxide solution. It will be appreciated that potassium hydroxide solution anisotropically etches the substrate, and the depth of the tub is therefore extremely controllable. During the etching, the top thick silicon oxide serves as an etching mask. By using conventional epitaxial techniques, a 2 ohm-centimeter N type silicon deposition is accomplished in the pot left during the etching process. This silicon deposited on the masking oxide is not single crystal, but polycrystalline with a rough surface. To insure the complete coverage of the N pot, the thickness of the epitaxial deposition is about 20 percent larger than that of the N pot etching. This constitutes back-filling of the substrate. The back-filled substrate is polished then with a 0.5 micron diamond polish and etched by an HCl solution to a smooth surface. Finally, a shown by step eight, a thermally oxidized silicon oxide layer having a 5,000 angstrom thickness is provided.

The result of either tub preparation method is the structure shown in FIG. 3. Up to this point the process is in general standard.

C-IGFET FORMATION

Briefly, openings in the oxide layer thus formed are provided for the active regions of both the P and N channel IGFETS by photlithographic techniques. The result is shown by the patterned oxide layer 37 in FIG. 3. The following is a brief summary of the process to be described. A gate oxide layer 38 is first thermally grown to about 800 angstroms in the region where silicon is exposed. To minimize the interface states, the gate oxidation is performed in a mixture of dry oxygen and argon at atmospheric pressure and at a temperature ranging from 1,000°C to 1,200°C. The surface treatment prior to the gate oxidation utilizes a cleaning step with hot chromic acid and hydrofluoric acid. All acid treatments described hereinafter are immediately followed by an ultra-pure deionized water rinse for five to ten minutes. It will be appreciated that this gate oxide is deposited between the barriers formed by the patterned oxide layer 37 so as to form the delimited layers 38 on the substrate. As shown in FIG. 5, the layers 38 are photolithographically patterned so as to remove these layers from the regions 39 where the source and drain diffusions are to be made. The central region 38 which forms the gate oxide is purposely made larger than the final geometry for the gate oxide so as to prevent any possibility of misalignment when a gate contact, 43, smaller than this gate oxide, is patterned as shown in connection with FIG. 7.

As shown in FIG. 6, a layer 40 of poly-silicon ranging in thickness from 4,000 to 5,000 angstroms is deposited over the entire top surface of the structure thus formed. The poly-silicon layer 40 can be formed by either the decomposition of silane or a conventional evaporation technique. The finished devices with either technique result in a good electrical stability and the predicted flat band voltage. The silane decomposited silicon film is processed at a temperature range from 600°C to 700°C and can be delineated by a solution containing nitrogen and hydrofluoric acid in relative propotions.

In the above mentioned evaporation technique, intrinsic silicon pellets are used as the evaporating source. When the thickness of the evaporating film is controlled by a Sloan rate monitor, a 10 percent variation in thickness is obtained. In one experimental configuration 85 percent step coverage was in evidence over the patterned silicon oxide layer 37 having a thickness of 5,000 angstroms. The evaporated silicon film is polycrystalline, and can be easily etched by solutions containing orthophosphoric acid, nitric acid, and acetic acid before high temperature treatment. However, after the high temperature $P^+$ or $N^+$ diffusion, the film becomes extremely densified and the etching rate turns slower by a factor of 10 or 20. Empirical results show that the evaporated, as well as chemically decomposed silicon films have diffusion coefficients two or three times greater than that of a single crystal. Although the charge transport mechanism of the film is not yet completely understood, the nondiffused film has a resistivity close to an intrinsic material.

Next, shown in FIG. 7, all the poly-silicon except those portions which remain as gate electrodes and source and drain electrodes is removed. This leaves a gate contact pad 44 and source and drain stripes 45 on top of the layer 37. In this step, the exposed gate oxide layer at each side of the poly-silicon gate is not etched. The portion not etched is shown by the arrows 12. Indeed in this etching step, no silicon oxide is etched due to the preferential etching of the etchant utilized. The etchants commonly used in this etching step are orthophosphoric acids, nitric acids and acetic acids. As can be seen, portions 46 of the original gate oxide layer 38 remain underneath the patterned electrodes for the source and drain regions. These regions 46 in combination with the gate oxide define the width of the source and drain regions.

Next, as shown in FIG. 8, a layer 48 of silicon oxide having a thickness between 2,000 and 3,000 angstroms is deposited on the whole top surface at a temperature of about 450°C. This is accomplished by oxidizing silane and oxygen. Then, as also shown in FIG. 8, the locations of the P channel IGFET source and drain outside the $P^-$ tub region 35 as well as points above electrodes 43, 44 and 45 are defined by a standard photolithographic process. This process uses a patterned photoresist mask shown at 49. When this structure is etched the structure shown in FIG. 9 results with polysilicon regions 43, 44, and 45 now being exposed along with regions for the source and drain of the P-IGFET. It will be appreciated that in this etching step the points 42 of the P channel IGFET are removed such that the layer 48 is etched away as shown with the gate contact 43' serving as an etch mask for the gate oxide. This preserves the self-aligned gate aspect of silicon gate devices. At this point the whole wafer is cleaned with chromic acid and buffered with hydrofluoric acid. The wafer is then subjected to a $P^+$ diffusion at approximately 1,000°C. This produces the $P^+$ type drain and source regions shown in FIG. 9 at 50 and 51. At the same time the exposed silicon layer 40 composed of electrodes 43, 44 and 45 also becomes $P^+$ doped. This diffusion is accomplished by using only the aforementioned predeposition steps absent any thermal oxidation. This prevents reducing the thickness of the poly-silicon layer 40 during doping. The use of the number 40' indicates doping of the layer 40.

In one embodiment, a boron tribromide liquid source is used. Boron tribromide from this source is picked up by an oxygen-nitrogen carrier gas and deposited and the unmasked surface of the wafer. The wafer is maintained at 1,000°C during this deposition which takes place over 15 minutes. During this 15 minute time period the boron impurities diffuse into the substrate to form the source and drain regions and to dope the poly-silicon to form both the gate, source and drain electrodes. The diffusion time is carefully determined so that it cannot be long enough to have boron impurities penetrating through the gate oxide or short enough to have the poly-silicon gate partially undiffused. Nevertheless, in choosing the diffusion time, the subsequent $N^+$ diffusion time has to be taken into consideration.

After the diffusion the wafer is subjected to a cleaning step consisting of hydrofluoric acid and nitric acid. Thereafter a layer of silicon oxide between 2,000 and 3,000 angstroms is deposited over the top surface of the structure formed. This layer is shown in FIG. 10 at 55.

Next, as shown in FIG. 10 the active regions of the N channel IGFET are defined in the same way as those of the P channel IGFET. After this definition the wafer is cleaned with chromic acid and buffered hydrofluroic acid. The wafer is then subjected to an $N^+$ diffusion at 975°C so that the $N^+$ drain and source regions 56 and 57 are formed in the $P^-$ tub region 35. It will be appreciated that the poly-silicon electrodes become $N^+$ doped in the same way that the P channel electrodes became doped. The $N^+$ diffusion system is similar to that of the $P^+$ diffusion except that the liquid source used is phorphorus oxychloride ($POCL_3$). The diffusion time is again carefully chosen so that the phosphorus impurity does not penetrate to the N channel IGFET gate oxide and so that the boron impurity does not drive through the P channel IGFET gate oxide. The $N^+$ diffusion depth is about 0.8 microns while the $P^-$ tub depth is about 4 to 5 microns. Too deep a source and drain could cause low drain breakdown voltage of the resultant N channel IGFET. After this process, the wafer is dipped clean with buffered hydrofluoric acid. This completes the formation of the active elements in the IGFET.

The structure which makes possible the aforementioned area reduction as well as the probing aspects of the invention is shown enclosed in the circle 60 which is an enlarged view of the structure shown enclosed in the circle 60 of FIG. 10. The enlarged diagram of FIG. 11 shows the penetration of doping atoms (indicated by the arrows 61) not only down into the substrate but also through the layer 40' so as to form the doped region 56'. This automatically connects the source region 56 to the doped poly 40' with the oxide layer 46 serving to delineate the edge 62 of the source region 56'. It will be appreciated that excellent ohmic contact is made between the doped electrode 40' and the source 56' due to the identity of the doping atoms therein. It will be further appreciated from this process that there is only one masking step utilized in forming the electrodes for the IGFET. This is the patterning step associated with the formation of electrodes 40. This single patterning step provides that the source and drain electrodes not extend much past the source and drain regions. It further provides an automatically aligned contact to the source and drain regions without the necessity of a second masking step, thereby eliminating a mask misalignment problem. This automatic alignment is called "self-aligning."

After the formation of the doped silicon electrodes and source and drain regions the subject invention is described. However, for completeness the metallization steps are outlined. No drawings are provided, however, since the metallization steps are conventional. As shown in the metallization portion of the remainder of Table I, a 6,000 angstrom thick layer of silicon oxide is deposited over the structure shown in FIG. 10 by the same glassing deposition technique used prior to the $P^+$ and $N^+$ diffusions. To improve device electrical stability, the wafer is densified in the $N^+$ diffusion furnace with a phosphrus oxyfluoride liquid source being turned on. The heavily $N^+$ doped top thin layer of silicon oxide at this step acts as a getter of any impurities; for example the heavy metal type of impurities that might be in the gate oxide or in the interface thereof with the substrate or the tub. Then after the wafer is cleaned with chromic acid and hydrofluoric acid preohmic windows are provided as shown by the preohmic holes 20 of FIG. 2. These preohmic windows are provided over a portion of the gate polycrystalline material and the source and drain polycrystalline silicon which runs to the edge of the chip and therefore does not require critcal masking. Following the preohmic window provision, a layer of aluminum film having an 8,000 angstrom thickness is deposited over the entire top surface by conventional evaporation techniques. Thereafter, the metal film is patterned by photolithographic masking techniques and the wafer processed through conventional passivation, passivation etch, gold-backing and wafer evaluation.

ALTERNATE TO THE DIFFUSION METHOD

What has been described is a diffusion method for making the active elements of an IGFET type device. There is, however, a deposition method in which the substrate is deposited with sandwich layers of silicon oxide, silicon nitride, and silicon oxide at 900°C in a vertical reactor. The purpose of the deposition method is to provide the source and drain regions for both the P-IGFET and the N-IGFET at the same time. This time refers to the time the $P^+$ diffusion takes place for the P-IGFET. The $P^+$ diffusion carries with it a considerable amount of heat. This heat drives in the $N^+$ impurities from a doped oxide layer over the N-IGFET device. For this method a three layer mask of silicon oxide, silicon nitride, and silicon oxide is used. Both layers of silicon oxide are deposited by the decomposition of silane and oxygen. The silicon nitride layer is formed by decompositing silane and ammonia. The $SiO_x$, $Si_xN_y$, $SiO_x$ mask is then etched over the regions at which both the P and N channel IGFETs are to be formed. This is done by photolithographic masking techniques as hereinbefore described. To etch the sandwich layers, three etching steps are taken. First, the top layer of silicon oxide is defined by the buffered hydrofluoric acid etching step and then the exposed silicon nitride is removed by orthophosphoric acid at 180°C. At this step the unremoved top layer of silicon oxide acts as an etch mask. Finally, the exposed bottom layer and top layer of silicon oxide are removed by buffered hydroluoric acid. The gate oxidation and poly-silicon deposition and definition are accomplished by the same techniques used in the diffusion method.

The deposition of the source and drain regions when takes place as follows: Two layers of silicon oxides are deposited over the entire upper surface of the wafer by decompositing phosphorus silane at 450°C. The lower of these two layers is doped silicon oxide referred to as phossil glass and the upper of these two layers is a cap of undoped silicon oxide. Then, the two layers comprising the phossil and pure silicon oxides are removed from the regions where the P channel IGFET is to be provided. During the etching process, all exposed silicon oxide down to the silicon nitride is etched away. Since the silicon nitride layer acts as an etch stop for the buffered hydrofluoric acid it only attacks silicon oxide.

Next, the wafer is subjected to the same $P^+$ diffusion used in the diffusion method. This forms the $P^+$ source and drain regions for the P-IGFET and dopes the P-IGFET poly electrodes. At the same time, the $P^-$ tub portions of the substrate which are in contact with the $N^+$ doped silicon oxide are simultaneously N doped to provide $N^+$ source and drain regions and doped only electrodes for the N-IGFET. During the diffusion, the phossil glass acts as a diffusion solid source. The capping of the pure silicon oxide prevents any out-diffusion from the phossil glass to interfere with the boron diffusion at the exposed silicon regions.

Next, the phossil silicon oxide and its capping layer are completely removed by a buffered hydrofluoric acid solution without photolithographic masking to eliminate the uneven oxide thereacross the wafer, since the silicon nitride beneath them serves as an etch stop. Finally, the wafer is processed through silicon oxide deposition, preohmic deposition, Al-Si evaporation, metal definition, passivation, passivation etch, gold-backing and wafer evaluation.

It will be appreciated that the structure resulting from the last mentioned series of steps is precisely the same as that for the diffusion method and that both the area savings and ability to probe intermediate structures are preserved thereby.

What is claimed is:

1. In a method for making insulated gate field-effect transistors, the improvement comprising:

forming patterned polycrystalline electrodes in contact with the areas on the substrate of said transistor at which the source and drain regions are to be formed; and forming said source and drain regions by diffusion through a top surface of said substrate and through that portion of said polycrystalline electrodes covering respective source and drain regions, whereby ohmic contact is made between said electrodes and corresponding source and drain regions due to the identity of the impurity atoms therein, whereby said transistors may be probed for electrical properties prior to metallization, and whereby said source and drain regions need not be enlarged to permit contact by said metallization.

2. The method recited in claim 1 and further including leaving a portion of the gate oxide layer under portions of each polycrystalline electrode to delimit the area of diffusion of said source and drain regions through said polycrystalline electrodes.

3. The method as recited in claim 2 wherein the gate oxide for said transistors is grown to 800 angstroms in a mixture of dry oxygen and argon at a temperature ranging from 1,000°C to 1,200°C, wherein said polycrystalline electrodes are silicon electrodes between 4,000 and 5,000 angstroms in thickness formed by the decomposition of silane.

4. A method for making insulated gate field-effect transistors so as to minimize the area at the active device necessary for contacting the source and drain regions thereof and so as to enable the probing and testing of intermediate structures made during fabrication of said insulated gate field-effect transistors comprising the steps of:

providing a semiconductor substrate of a first conductivity type with a first insulating layer opened so as to expose a region where the active components of an insulated gate field-effect transistor are to be formed;

forming a first oxide layer on said exposed region, said first oxide layer being patterned so as to expose areas on said substrate corresponding in position to the positions of the source and drain regions to be made;

forming a layer of polycrystalline silicon over the structure thus formed;

patterning said polycrystalline silicon layer so as to form source, drain and gate electrodes, portions of said source and drain electrodes overlying portions of the locations at which source and drain regions are to be formed;

diffusing into said source and drain regions and also into said polycrystalline silicon layer a dopant having a conductivity type opposite that of said substrate, portions of said source and drain regions being diffused through portions of overlying polycrystalline silicon electrodes, whereby said patterned polycrystalline silicon layer is doped highly enough such that portions thereof serve as electrodes, whereby said source and drain regions are formed in ohmic contact with respective electrodes, portions of said source and drain regions having been doped through portions of corresponding electrodes, and whereby said structure may be probed after said diffusion step for insulated gate field-effect transistor properties.

5. The method as recited in claim 4 wherein said polycrystalline silicon layer is between 4,000 and 5,000 angstroms in thickness, and is evaporated onto said substrate from silicon pellets used as the evaporating source.

6. The method as recited in claim 4 wherein said polycrystalline silicon is formed by the decomposition of silane at between 600° and 700°C.

7. A method for making insulated gate field-effect transistors so as to minimize the area at the active device necessary to contacting the source and drain regions thereof and so as to enable the probing and testing of intermediate structures made during fabrication of said insulated gate field-effect transistors comprising the steps of:

providing a semiconductor substrate of a first conductivity type with a first insulating layer opened so as to expose a region where the active components of an insulated gate field-effect transistor are to be formed;

forming a first oxide layer on said exposed region, said first oxide layer being patterned so as to expose areas on said substrate corresponding in position to the positions of the source and drain regions to be made, said first oxide layer being patterned to form an oversized gate oxide region;
forming a layer of polycrystalline silicon over the structure thus formed;
patterning said polycrystalline silicon layer so as to form source, drain and gate electrodes, said gate electrode being smaller than said oversized gage oxide region;
forming a second oxide layer over the structure thus formed;
forming a mask over said second oxide layer;
opening said mask over all of said patterned polycrystalline silicon and over those areas at which active elements of said insulated gate field-effect transistor are to be formed;
etching said second oxide layer through the openings in said mask with an etchant that does not attack polycrystalline silicon, whereby said patterned polycrystalline silicon is exposed and said substrate is exposed in regions where said source and drain are to be made, the gate polycrystalline silicon serving as an etch mask such that both the gate oxide and adjacent edges of the source and drain regions to be formed are aligned with said gate polycrystalline silicon electrode; and
diffusing atoms of a type opposite that of said substrate into said polycrystalline silicon electrodes and into the exposed portions of said substrate, whereby said patterned polycrystalline silicon layer is doped highly enough such that portions thereof serve as electrodes, whereby said source and drain regions are formed in ohmic contact with respective electrodes, portions of said source and drain regions having been doped through portions of corresponding electrodes, and whereby said structure may be probed after said diffusion step for insulated gate field effect transistor properties.

8. The method as recited in claim 7 wherein said patterned polycrystalline silicon layer is between 4,000 and 5,000 angstroms in thickness and wherein the etchant which does not attack polycrystalline silicon but which does etch said second oxide layer is taken from the group of acids consisting of nitric acid, acetic acid and ortho-phosphoric acids.

* * * * *